(12) United States Patent
Poghosyan et al.

(10) Patent No.: US 12,057,296 B2
(45) Date of Patent: Aug. 6, 2024

(54) ELECTROMAGNETIC FIELD SENSING DEVICE

(71) Applicant: COMET TECHNOLOGIES USA, INC., San Jose, CA (US)

(72) Inventors: Tigran Poghosyan, San Jose, CA (US); Anthony Oliveti, San Jose, CA (US); J. Kirkwood Rough, San Jose, CA (US)

(73) Assignee: COMET TECHNOLOGIES USA, INC., San Jose, CA (US)

( * ) Notice: Subject to any disclaimer, the term of this patent is extended or adjusted under 35 U.S.C. 154(b) by 396 days.

(21) Appl. No.: 17/673,536

(22) Filed: Feb. 16, 2022

(65) Prior Publication Data

US 2022/0270859 A1 Aug. 25, 2022

Related U.S. Application Data

(60) Provisional application No. 63/151,896, filed on Feb. 22, 2021.

(51) Int. Cl.
| | |
|---|---|
| *H01J 37/32* | (2006.01) |
| *G01R 29/08* | (2006.01) |
| *H03H 7/38* | (2006.01) |

(52) U.S. Cl.
CPC .... *H01J 37/32183* (2013.01); *G01R 29/0878* (2013.01); *H03H 7/38* (2013.01)

(58) Field of Classification Search
CPC .. H01J 37/32183; G01R 29/0878; H03H 7/38
See application file for complete search history.

(56) References Cited

U.S. PATENT DOCUMENTS

| | | |
|---|---|---|
| 4,679,007 A | 7/1987 | Reese et al. |
| 5,175,472 A | 12/1992 | Johnson, Jr. et al. |

(Continued)

FOREIGN PATENT DOCUMENTS

| | | |
|---|---|---|
| JP | 04239211 A | 8/1992 |
| JP | 05284046 A | 8/1993 |

(Continued)

OTHER PUBLICATIONS

PCT/US2022/016803—International Search Report and Written Opinion of International Searching Authority, dated Jun. 9, 2022, 9 pages.

(Continued)

*Primary Examiner* — Henry Luong
(74) *Attorney, Agent, or Firm* — Nolte Lackenbach Siegel

(57) ABSTRACT

An electromagnetic field sensor may include a housing including an opening extending therethrough; a dielectric element including a first section having a first interior space and a second section having a second interior space, the dielectric element being received within the opening of the housing; and a conductor disposed within and approximating the first interior space and the second interior space of the dielectric element, the conductor including a first portion defining a first frustrum shape and a second portion defining a second frustrum shape, the first interior space receiving the first portion of the conductor and the second interior space receiving the second portion of the conductor. The electromagnetic field sensor for use in a matching network of a plasma generation system or other application.

20 Claims, 11 Drawing Sheets

(56) References Cited

U.S. PATENT DOCUMENTS

| | | |
|---|---|---|
| 5,195,045 A | 3/1993 | Keane et al. |
| 5,394,061 A | 2/1995 | Fujii |
| 5,474,648 A | 12/1995 | Patrick et al. |
| 5,576,629 A | 11/1996 | Turner et al. |
| 5,609,737 A | 3/1997 | Fukui et al. |
| 5,629,653 A | 5/1997 | Stimson |
| 5,737,175 A | 4/1998 | Grosshart et al. |
| 5,792,261 A | 8/1998 | Hama et al. |
| 5,810,963 A | 9/1998 | Tomioka |
| 5,842,154 A | 11/1998 | Harnett et al. |
| 5,849,136 A | 12/1998 | Mintz et al. |
| 5,866,869 A | 2/1999 | Schneider |
| 5,889,252 A | 3/1999 | Williams et al. |
| 5,910,886 A | 6/1999 | Coleman |
| 5,914,974 A | 6/1999 | Partlo |
| 6,016,131 A | 1/2000 | Sato et al. |
| 6,157,179 A | 12/2000 | Miermans |
| 6,164,241 A | 12/2000 | Chen et al. |
| 6,252,354 B1 | 6/2001 | Collins et al. |
| 6,313,584 B1 | 11/2001 | Johnson et al. |
| 6,313,587 B1 | 11/2001 | MacLennan et al. |
| 6,326,597 B1 | 12/2001 | Lubomirsky et al. |
| 6,407,648 B1 | 6/2002 | Johnson |
| 6,455,437 B1 | 9/2002 | Davidow et al. |
| 6,463,875 B1 | 10/2002 | Chen et al. |
| 6,507,155 B1 | 1/2003 | Barnes et al. |
| 6,677,828 B1 | 1/2004 | Harnett et al. |
| 6,703,080 B2 | 3/2004 | Reyzelman |
| 6,806,437 B2 | 10/2004 | Oh |
| 6,876,155 B2 | 4/2005 | Howald et al. |
| 6,894,245 B2 | 5/2005 | Hoffman |
| 6,949,887 B2 | 9/2005 | Kirkpatrick et al. |
| 7,030,335 B2 | 4/2006 | Hoffman |
| 7,042,311 B1 | 5/2006 | Hilliker et al. |
| 7,079,597 B1 | 7/2006 | Kenwood |
| 7,102,292 B2 | 9/2006 | Parsons et al. |
| 7,192,505 B2 | 3/2007 | Roche et al. |
| 7,196,283 B2 | 3/2007 | Buchberger, Jr. |
| 7,215,697 B2 | 5/2007 | Hill et al. |
| 7,220,937 B2 | 5/2007 | Hoffman |
| 7,251,121 B2 | 7/2007 | Bhutta |
| 7,259,623 B2 | 8/2007 | Coleman |
| 7,298,128 B2 | 11/2007 | Bhutta |
| 7,467,612 B2 | 12/2008 | Suckewer |
| 7,514,936 B2 | 4/2009 | Anwar |
| 7,795,877 B2 | 9/2010 | Radtke |
| 7,796,368 B2 | 9/2010 | Kotani |
| 8,169,162 B2 | 5/2012 | Yuzurihara |
| 8,203,372 B2 | 6/2012 | Arduini |
| 8,222,822 B2 | 7/2012 | Gilbert |
| 8,421,377 B2 | 4/2013 | Kirchmeier |
| 8,466,622 B2 | 6/2013 | Knaus |
| 8,471,746 B2 | 6/2013 | Kurunezi et al. |
| 8,491,759 B2 | 7/2013 | Pipitone et al. |
| 8,742,669 B2 | 6/2014 | Carter et al. |
| 8,779,662 B2 | 7/2014 | Boston |
| 8,803,424 B2 | 8/2014 | Boston |
| 8,884,180 B2 | 11/2014 | Ilic |
| 8,896,391 B2 | 11/2014 | du Toit |
| 8,928,229 B2 | 1/2015 | Boston |
| 9,042,121 B2 | 5/2015 | Walde et al. |
| 9,065,426 B2 | 6/2015 | Mason et al. |
| 9,105,447 B2 | 8/2015 | Brouk et al. |
| 9,111,725 B2 | 8/2015 | Boston |
| 9,124,248 B2 | 9/2015 | Van Zyl et al. |
| 9,142,388 B2 | 9/2015 | Hoffman et al. |
| 9,148,086 B2 | 9/2015 | Fife et al. |
| 9,166,481 B1 | 10/2015 | Vinciarelli |
| 9,171,700 B2 | 10/2015 | Gilmore |
| 9,196,459 B2 | 11/2015 | Bhutta |
| 9,208,992 B2 | 12/2015 | Brouk et al. |
| 9,224,579 B2 | 12/2015 | Finley et al. |
| 9,225,299 B2 | 12/2015 | Mueller et al. |
| 9,287,098 B2 | 3/2016 | Finley et al. |
| 9,294,100 B2 | 3/2016 | Van Zyl et al. |
| 9,306,533 B1 | 4/2016 | Mavretic |
| 9,313,870 B2 | 4/2016 | Walde et al. |
| 9,337,804 B2 | 5/2016 | Mason et al. |
| 9,345,122 B2 | 5/2016 | Bhutta |
| 9,385,021 B2 | 7/2016 | Chen |
| 9,418,822 B2 | 8/2016 | Kaneko |
| 9,478,397 B2 | 10/2016 | Blackburn et al. |
| 9,483,066 B2 | 11/2016 | Finley et al. |
| 9,490,353 B2 | 11/2016 | Van Zyl et al. |
| 9,496,122 B1 | 11/2016 | Bhutta |
| 9,520,269 B2 | 12/2016 | Finley et al. |
| 9,524,854 B2 | 12/2016 | Hoffman et al. |
| 9,525,412 B2 | 12/2016 | Mavretic |
| 9,536,713 B2 | 1/2017 | Van Zyl et al. |
| 9,543,122 B2 | 1/2017 | Bhutta |
| 9,544,987 B2 | 1/2017 | Mueller et al. |
| 9,558,917 B2 | 1/2017 | Finley et al. |
| 9,577,516 B1 | 2/2017 | Van Zyl et al. |
| 9,584,090 B2 | 2/2017 | Mavretic |
| 9,578,731 B2 | 3/2017 | Hoffman et al. |
| 9,591,739 B2 | 3/2017 | Bhutta |
| 9,589,767 B2 | 4/2017 | Finley et al. |
| 9,620,340 B2 | 4/2017 | Finley et al. |
| 9,651,957 B1 | 5/2017 | Finley et al. |
| 9,660,613 B2 | 5/2017 | Van Zyl et al. |
| 9,673,028 B2 | 6/2017 | Walde et al. |
| 9,697,911 B2 | 7/2017 | Bhutta |
| 9,711,331 B2 | 7/2017 | Mueller et al. |
| 9,711,335 B2 | 7/2017 | Christie et al. |
| 9,728,378 B2 | 8/2017 | Bhutta et al. |
| 9,729,122 B2 | 8/2017 | Mavretic |
| 9,741,544 B2 | 8/2017 | Van Zyl et al. |
| 9,745,660 B2 | 8/2017 | Bhutta |
| 9,748,076 B1 | 8/2017 | Choi et al. |
| 9,755,641 B1 | 9/2017 | Bhutta |
| 9,773,644 B2 | 9/2017 | Van Zyl et al. |
| 9,807,863 B1 | 10/2017 | Van Zyl et al. |
| 9,812,305 B2 | 11/2017 | Pelleymounter et al. |
| 9,844,127 B2 | 12/2017 | Bhutta |
| 9,852,890 B2 | 12/2017 | Mueller et al. |
| 9,854,659 B2 | 12/2017 | Van Zyl et al. |
| 9,865,432 B1 | 1/2018 | Bhutta |
| 9,952,297 B2 | 4/2018 | Wang |
| 10,008,317 B2 | 6/2018 | Iyer |
| 10,020,752 B1 | 7/2018 | Vinciarelli |
| 10,026,592 B2 | 7/2018 | Chen |
| 10,026,594 B2 | 7/2018 | Bhutta |
| 10,026,595 B2 | 7/2018 | Choi et al. |
| 10,074,518 B2 | 9/2018 | Van Zyl et al. |
| 10,139,285 B2 | 11/2018 | Murray et al. |
| 10,141,788 B2 | 11/2018 | Kamstedt |
| 10,194,518 B2 | 1/2019 | Van Zyl et al. |
| 10,217,618 B2 | 2/2019 | Larson et al. |
| 10,224,184 B2 | 3/2019 | Van Zyl |
| 10,224,186 B2 | 3/2019 | Polak et al. |
| 10,263,577 B2 | 4/2019 | Van Zyl et al. |
| 10,269,540 B1 | 4/2019 | Carter et al. |
| 10,314,156 B2 | 6/2019 | Van Zyl et al. |
| 10,332,730 B2 | 6/2019 | Christie et al. |
| 10,340,879 B2 | 7/2019 | Mavretic |
| 10,373,811 B2 | 8/2019 | Christie et al. |
| 10,374,070 B2 | 8/2019 | Wood |
| 10,410,836 B2 | 9/2019 | McChesney |
| 10,411,769 B2 | 9/2019 | Bae |
| 10,447,174 B1 | 10/2019 | Porter, Jr. et al. |
| 10,469,108 B2 | 11/2019 | Howald |
| 10,475,622 B2 | 11/2019 | Pankratz et al. |
| 2003/0076092 A1 | 4/2003 | Hoshino |
| 2003/0121609 A1 | 7/2003 | Ohmi et al. |
| 2003/0150710 A1 | 8/2003 | Evans et al. |
| 2003/0230984 A1 | 12/2003 | Kitamura et al. |
| 2004/0016402 A1 | 1/2004 | Walther et al. |
| 2004/0026235 A1 | 2/2004 | Stowell, Jr. |
| 2005/0034811 A1 | 2/2005 | Mahoney et al. |
| 2005/0045475 A1 | 3/2005 | Wantanabe |
| 2005/0270805 A1 | 12/2005 | Yasumura |
| 2006/0005928 A1 | 1/2006 | Howald |
| 2006/0169582 A1 | 8/2006 | Brown et al. |
| 2006/0169584 A1 | 8/2006 | Brown et al. |

(56) References Cited

U.S. PATENT DOCUMENTS

| | | |
|---|---|---|
| 2006/0249729 A1 | 11/2006 | Mundt et al. |
| 2007/0121267 A1 | 5/2007 | Kotani |
| 2007/0222428 A1* | 9/2007 | Garvin ............. H01J 37/32082 |
| | | 324/687 |
| 2008/0061793 A1 | 3/2008 | Anwar et al. |
| 2008/0061901 A1 | 3/2008 | Gilmore |
| 2008/0087381 A1 | 4/2008 | Shannon et al. |
| 2008/0197854 A1 | 8/2008 | Valcore et al. |
| 2008/0272875 A1 | 11/2008 | Huang et al. |
| 2008/0317974 A1 | 12/2008 | de Vries |
| 2009/0026964 A1 | 1/2009 | Knaus |
| 2009/0206974 A1 | 8/2009 | Meinke |
| 2009/0234619 A1 | 9/2009 | Iwanami et al. |
| 2010/0012029 A1 | 1/2010 | Forester et al. |
| 2010/0072172 A1 | 3/2010 | Ji et al. |
| 2010/0096261 A1 | 4/2010 | Hoffman et al. |
| 2010/0098882 A1 | 4/2010 | Lubomirsky et al. |
| 2010/0159120 A1 | 6/2010 | Dzengeleski et al. |
| 2011/0121735 A1 | 5/2011 | Penny |
| 2011/0125429 A1 | 5/2011 | Kazama et al. |
| 2011/0140607 A1 | 6/2011 | Moore et al. |
| 2011/0148303 A1 | 6/2011 | Van Zyl et al. |
| 2011/0174777 A1 | 7/2011 | Jensen et al. |
| 2012/0097104 A1 | 4/2012 | Pipitone et al. |
| 2012/0097524 A1 | 4/2012 | Pipitone et al. |
| 2012/0145322 A1 | 6/2012 | Gushiken et al. |
| 2012/0164834 A1 | 6/2012 | Jennings et al. |
| 2012/0262064 A1 | 10/2012 | Nagarkatti |
| 2013/0002136 A1 | 1/2013 | Blackburn et al. |
| 2013/0140984 A1 | 6/2013 | Hirayama |
| 2013/0180964 A1 | 7/2013 | Ilic |
| 2013/0214683 A1 | 8/2013 | Valcore et al. |
| 2013/0240482 A1 | 9/2013 | Nam et al. |
| 2013/0278140 A1 | 10/2013 | Mudunuri et al. |
| 2013/0345847 A1 | 12/2013 | Valcore et al. |
| 2014/0225504 A1 | 8/2014 | Kaneko |
| 2014/0239813 A1 | 8/2014 | Van Zyl |
| 2014/0265911 A1 | 9/2014 | Kamata et al. |
| 2014/0328027 A1 | 11/2014 | Zhang et al. |
| 2014/0367043 A1 | 12/2014 | Bishara et al. |
| 2015/0002020 A1 | 1/2015 | Boston |
| 2015/0115797 A1 | 4/2015 | Yuzurihara |
| 2015/0150710 A1 | 6/2015 | Evans et al. |
| 2015/0313000 A1 | 10/2015 | Thomas et al. |
| 2016/0002020 A1 | 1/2016 | Orita |
| 2016/0248396 A1 | 8/2016 | Mavretic |
| 2016/0308560 A1 | 10/2016 | Howald et al. |
| 2017/0018349 A1 | 1/2017 | Otsubo et al. |
| 2017/0133886 A1 | 5/2017 | Kurs et al. |
| 2017/0307776 A1 | 10/2017 | Pan et al. |
| 2017/0338081 A1 | 11/2017 | Yamazawa |
| 2017/0345620 A1 | 11/2017 | Coumou et al. |
| 2018/0034446 A1 | 1/2018 | Wood |
| 2018/0102238 A1 | 4/2018 | Gu et al. |
| 2018/0261431 A1 | 9/2018 | Hammond, IV |
| 2019/0172683 A1 | 6/2019 | Mavretic |
| 2019/0199241 A1 | 6/2019 | Satoshi et al. |
| 2019/0385822 A1 | 9/2019 | Yoshida et al. |

FOREIGN PATENT DOCUMENTS

| | | |
|---|---|---|
| JP | 2006-310245 A | 6/2008 |
| JP | 2010-016124 A | 1/2010 |
| JP | 2015-502213 A | 1/2015 |
| KR | 10-2006-0067957 A | 6/2006 |
| KR | 10-2014-0077866 A | 6/2014 |
| KR | 10-2017-0127724 A | 11/2017 |
| KR | 10-2018-0038596 A | 4/2018 |
| WO | 2012054305 | 4/2012 |
| WO | 2012054306 | 4/2012 |
| WO | 2012054307 | 4/2012 |
| WO | 2016048449 A1 | 3/2016 |
| WO | 2016097730 | 6/2016 |
| WO | 2019096564 A1 | 5/2019 |
| WO | 2019147513 A1 | 8/2019 |
| WO | 2019-244734 A1 | 12/2019 |

OTHER PUBLICATIONS

PCT/US2018/062951—International Search Report and Written Opinion of International Searching Authority, dated Aug. 28, 2019, 10 pages.

Stowell, et al., "RF-superimposed DC and pulsed DC sputtering for deposition of transparent conductive oxides", Thin Solid Films 515 (2007), pp. 7654-7657.

Bender, et al., "Characterization of a RF=do-magnetron discharge for the sputter deposition of transparent and highly conductive ITO films", Appl. Phys. A 69, (1999), pp. 397-409.

Economou, Demetre J., "Fundamentals and application of ion-ion plasmas", Applied Surface Science 253 (2007), pp. 6672-6680.

Godyak et al., "Plasma parameter evolution in a periodically pulsed ICP", XXVIIth, Eindhoven, the Netherlands, Jul. 18-22, 2005, 4 pages.

Banna, et al., "Inductively Coupled Pulsed Plasmas in the Presence of Synchronous Pulsed Substrate Bias for Robust, Reliable, and Fine Conductor Etching", IEEE Transactions on Plasma Science, vol. 37, No. 9, Sep. 2009, pp. 1730-1746.

Kushner, Mark J., "Pulsed Plasmas as a Method to Improve Uniformity During Materials Processing", Journal of Applied Physics, Jul. 1, 2004, vol. 96, No. 1, pp. 82-93.

LTM Technologies, M. Haass "Synchronous Plasma Pulsing for Etch Applications", Apr. 3, 2010 16 pages.

PCT/US2020/038892—International Search Report and Written Opinion of the International Searching Authority, dated Oct. 6, 2020, 3 pages.

PCT/US2020/038899—International Search Report and Written Opinion of the International Searching Authority, dated Sep. 26, 2019, 5 pages.

PCT/US2021/012847—International Search Report and Written Opinion of the International Searching Authority, dated May 6, 2021, 11 pages.

PCT/US2021/012849 International Search Report and Written Opinion of the International Searching Authority, dated May 10, 2021, 11 pages.

PCT/US2021/012851 International Search Report and Written Opinion of the International Searching Authority, dated May 6, 2021, 10 pages.

* cited by examiner

ELECTROMAGNETIC FIELD SENSING DEVICE

CROSS-REFERENCE TO RELATED APPLICATIONS

This application claims priority to U.S. Prov. App. 63/151,896, filed Feb. 22, 2021, which is incorporated herein in its entirety. All available rights are claimed, including the right of priority.

BACKGROUND

Electromagnetic field (EMF) sensors including current sensors such as PEARSON coils are well-known in the art. As shown in FIGS. 1-2B, a voltage, current and impedance sensor S may include a housing 30 that has a center bore 32 for receiving a length of coaxial cable, which includes a center conductor A and a cylindrical insulator layer B disposed within the center conductor A. The cylindrical insulator layer B may be formed from a dielectric material, which may include, for example, PTFE, ceramics, etc. Within recesses 34 and 36 are fitted voltage/current sense circuit boards (not shown) that include capacitive plate and/or magnetic loop that are arranged in parallel with the center conductor A on opposing sides thereof and function to sense the electrical characteristics of the center conductor A.

Conventional EMF sensors require precise assembly and continued maintenance to ensure the accuracy of sensor S. Tuning and maintenance is important as misalignment of the center conductor A relative to the cylindrical insulator layer B could cause a change of coupling coefficient and characteristic impedance of the sensor and concentricity of the inner and outer conductors of the coaxial structure. For example, air pockets or other defects in the geometry that would cause a change of effective—coupling coefficient and characteristic impedance of the sensor. An EMF sensor that is misaligned would read differently as compared to a properly aligned (calibrated) EMF sensor. In this example, because air is a dielectric or insulator, separation (or any change of effected dielectric constant or concentricity) between the center conductor A and outer conductors would likely result in improper readings as the calibration for such a sensor would no longer be correct as coupling coefficient and characteristic impedance would not be the same as calibrated one.

Even with proper assembly, over time, the forces (e.g., axial force and radial force), which may result from temperature changes or other loads or stressors, that are exerted upon the center conductor A would result in relative moving of the center conductor A with respect to the insulator layer B. This relative movement of the center conductor A with respect to the insulator layer B may result in a change of coupling coefficient and characteristic impedance. The spacing of the center conductor A apart from the insulator layer B may be caused, in this example, by air pocket(s) between the center conductor A and the insulator layer B. If the stress is significant, substantial air gaps may appear and may also cause electrical arcing which could damage the sensor itself or even nearby equipment.

Therefore, there is a continuing need for an improved design to facilitate a less error prone assembly that would not have (or allow development of over time) a gap between the center conductor A and the insulator layer B and change of coupling coefficient and characteristic impedance. The present disclosure provides a solution to the above-described problem and provides embodiments in which the applied forces (e.g., axial and radial forces) may actually result in a tighter fit between the center conductor A and the insulator layer B.

It should be understood that the background is provided to aid in an understanding of the present invention and that nothing in the background section shall be construed as an admission of prior art in relation to the inventions described herein.

SUMMARY

In an embodiment, an electromagnetic field sensor may include a housing including an opening extending therethrough; a dielectric element including a first section having a first interior space and a second section having a second interior space, the dielectric element being received within the opening of the housing; and a conductor disposed within and approximating the first interior space and the second interior space of the dielectric element, the conductor including a first portion defining a first frustrum shape and a second portion defining a second frustrum shape, the first interior space receiving the first portion of the conductor and the second interior space receiving the second portion of the conductor.

These and other aspects of the present disclosure are described in greater detail below with reference to the accompanying figures.

DETAILED DESCRIPTION

Various embodiments and aspects of the present disclosure will be described with reference to the accompanying drawings. The following description and drawings are illustrative of the present disclosure and are not to be construed as limited the disclosure. Numerous specific details are described to provide a thorough understanding of various embodiments of the present disclosure. However, in certain circumstances, well-known or conventional details are not described in order to provide a concise discussion of embodiments of the present disclosure. As is standard in the practice of providing drawings, the drawings are not necessarily to scale relative to each other and like elements are given the same reference numbers in the different views.

FIGS. 3A-5B depict different perspective, sectional, and exploded sectional views of an electromagnetic field sensor 100. Sensor 100 may be used for any electromagnetic field including, for example, radiofrequency (RF). Sensor 100 is an electromagnetic field sensing device that may be used in a matching network (one example discussed below with reference to FIG. 8) or may be connected to a controller of an RF generator. For example, the sensor 100 may be electrically coupled to an RF power generator (not shown) that supplies RF power to a matching network (see FIG. 8). A controller (not shown) can be configured to control the RF power generator. The sensor 100 can be connected between the controller and the RF power generator.

Figure 4A:
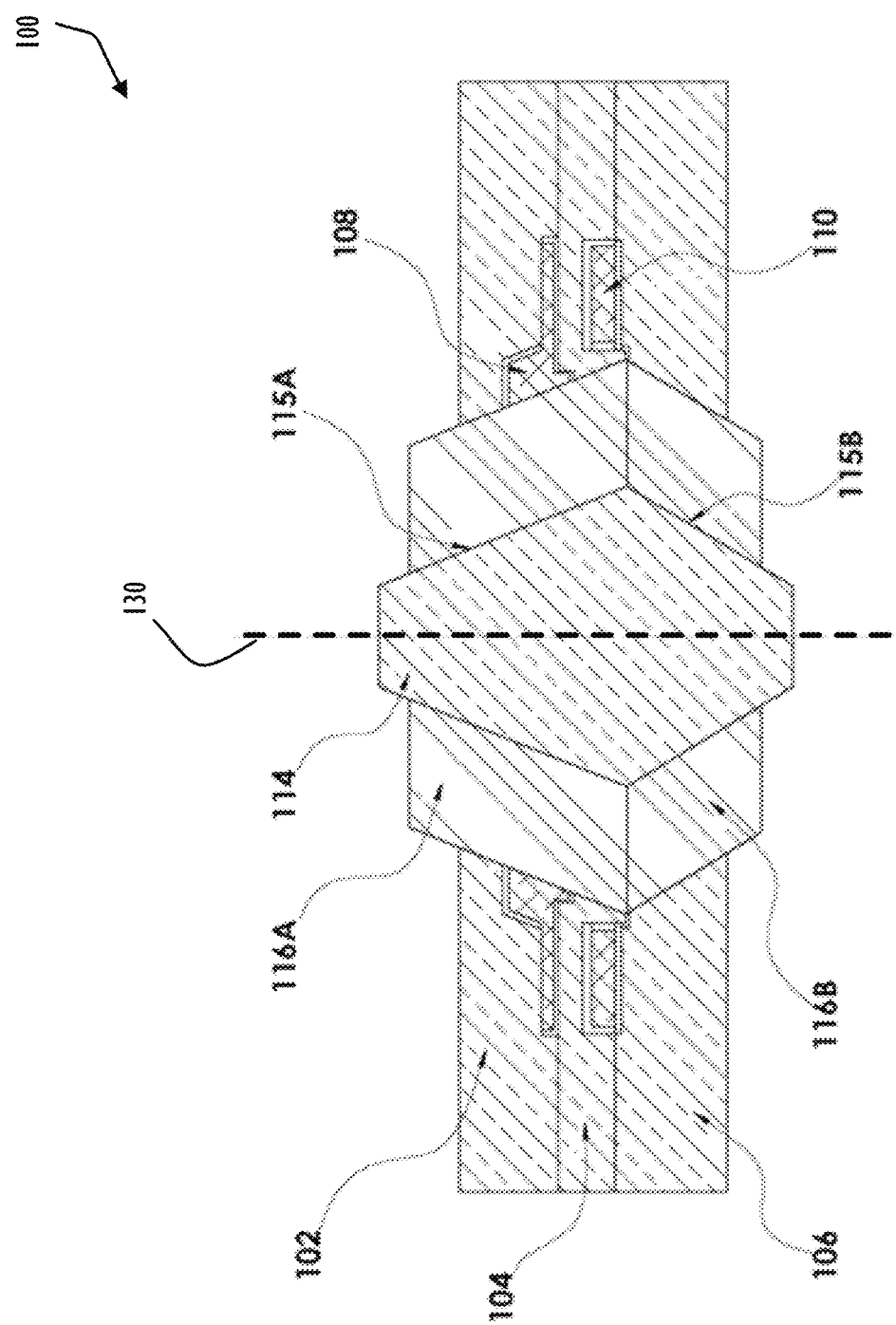
FIG. 4A is a second side cross-sectional view of a sensor of FIG. 3A.
Figure 4B:
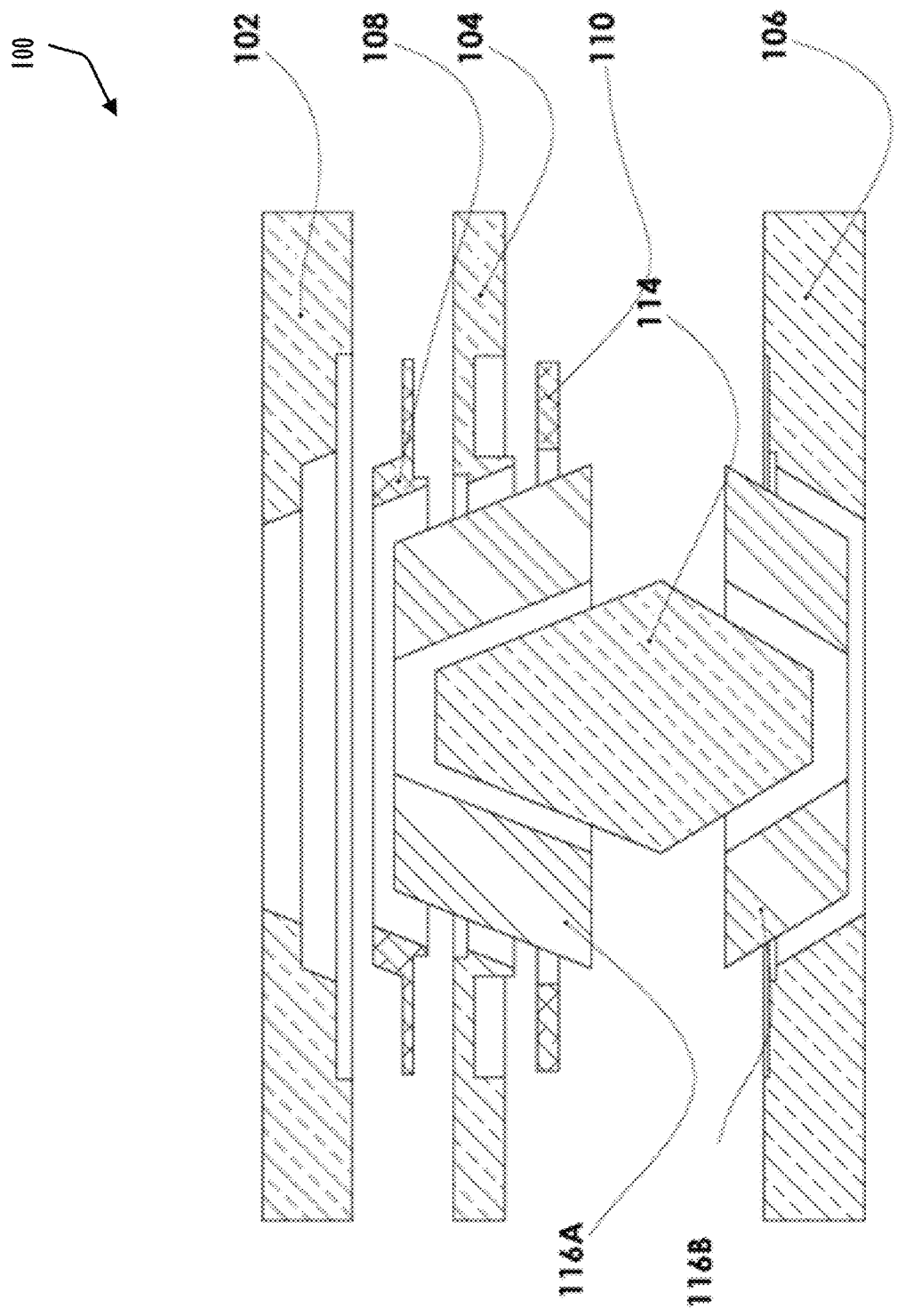
FIG. 4B is an exploded view of the view of FIG. 4A for the sensor of FIG. 3A.

Referring now to FIG. 4A-4B, when the sensor 100 is assembled, portions of the sensor 100 may be configured within a housing that includes multiple sections that are coupled together during assembly of the component parts of sensor 100. A pair of electric and magnetic couplers, EM couplers, (pick up structures, which might be in the form of a printed circuit board "PCB" or otherwise constructed) may be secured as functional layers of sensor 100. The EM couplers (in this example upper coupler is a conductive plate forming ring 108 and lower coupler is a conductive plate forming ring 110 (also see FIG. 5A-B)) may then each be electrically coupled to an electrical input which may be coupled to an electrical source (not shown) of the matching network (see FIG. 8). In the fully assembled state, the first dielectric 116A and the second dielectric 116B may be coupled to one another to each define first and second sections of a singular dielectric element that is secured and prevented from moving within the interior spaces that are defined by the housing and other components therein.

Figure 5A:
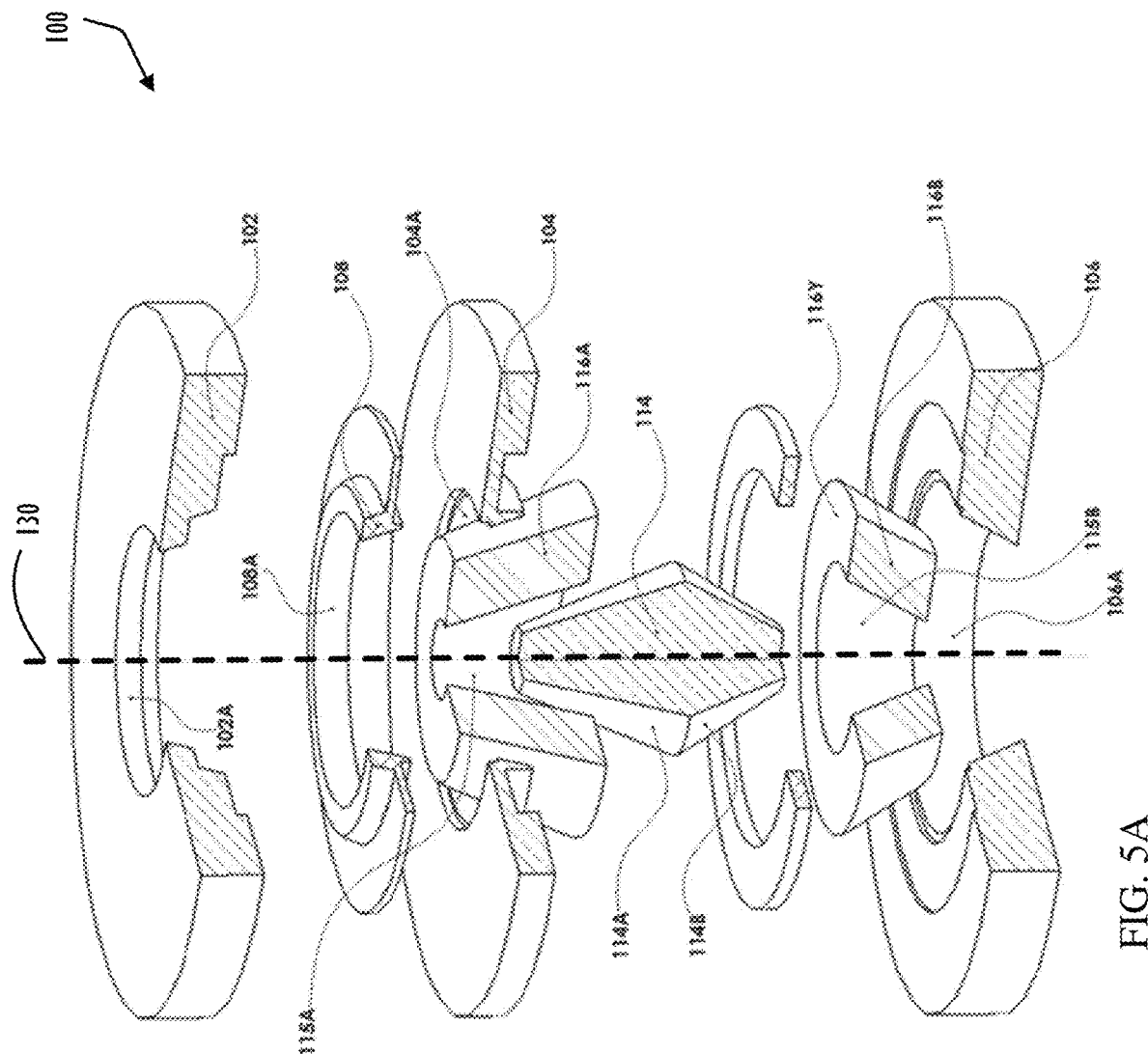
FIG. 5A depicts a first perspective view of an exploded layered view of the sensor of FIG. 3A.

The central conductor 114 may be disposed along a vertically extending axis y 130. As illustrated in FIG. 5A, axis y 130 extends through a bore 102a defined within the first housing section 102, a bore 104a defined within the intermediate housing section 104, and a bore 106a defined within the second housing section 106. The center of each of the bores 102a, 104a, and 106a being aligned along the vertically extending axis y 130. Thus, there are three layered housing sections comprising the first, intermediate, and second housing sections (102, 104, and 106 respectively).

As illustrated in FIG. 5A, a first portion 114A of the central conductor 114 may be received within an interior space 115A of a first dielectric 116A and a second portion 114B of the central conductor 114 may be received within an interior space 115B of a second dielectric 116B such that the central conductor 114 is disposed in close contact with the surfaces defining the interior spaces 115A and 115B of the first dielectric 116A and the second dielectric 116B, respectively. The first portion 114A of the central conductor 114 may be friction fitted within the interior space 115A of the first dielectric 116A. In addition, the interior space 115B may engage surfaces of the central conductor 114 that correspond to surfaces 717E and 717F (see FIG. 7) to maintain the central conductor 114 within the interior space 115B of the second dielectric 116B.

Figure 5B:
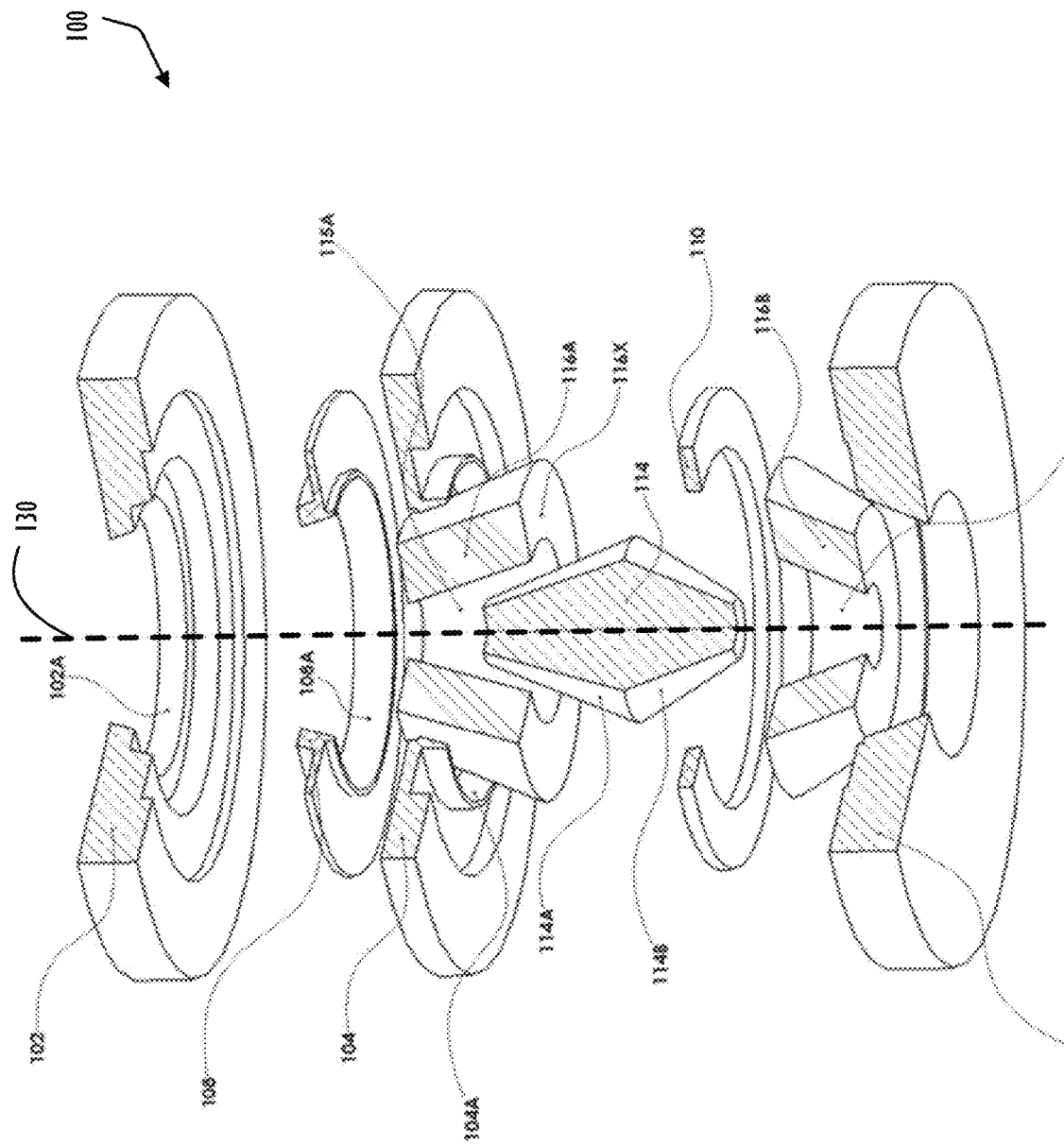
FIG. 5B depicts a second perspective view of the exploded layered view of FIG. 5A for the sensor of FIG. 3A.

A method of assembly of sensor 100 is explained with reference to FIGS. 5A-B. Referring to the exploded view of FIG. 5B, ring 110 is mounted to second section 106. Ring 110 may be a magnetic field pickup structure that includes loops of wire having a normal vector of cross section perpendicular to Y axis 130. Next, ring 108 with a concave section is mounted within first section 102. Ring 108 may be an electric field pickup structure. As can be seen from FIG. 5A, surface 108A is exposed to central conductor 114 through first dielectric 116A which thereby forms a capacitive structure. As a result, the capacitive coupling to central conductor 114 allows ring 108 to sense electrical fields.

Figure 3A:
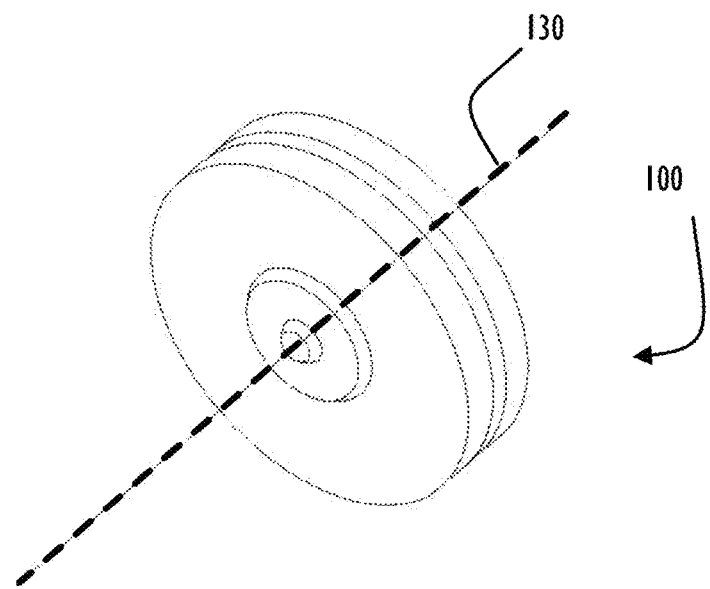
FIG. 3A is a perspective view of a sensor in accordance with the present disclosure.
Figure 3B:
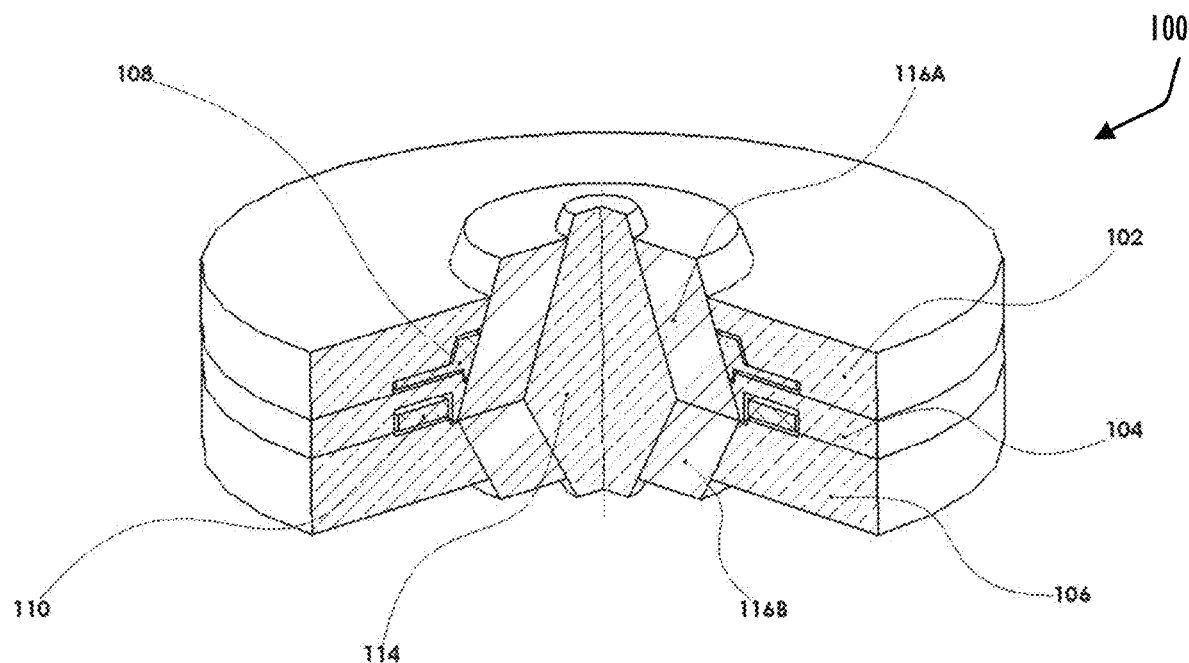
FIG. 3B is a first side cross-sectional view of the sensor of FIG. 3A.

Second dielectric 116B may be put into second section 106 (i.e., aligned and inserted within bore 106A). Intermediate section 104 may then be mounted to second section 106. Central conductor 114 may then be place within second dielectric 116B. First dielectric 116A may be placed onto the top portion of central conductor 114. Finally, first section 102 (with ring 108 mounted inside) may be placed onto intermediate section 104. In this manner the components shown in FIGS. 5A-5B may be layered and interlocked to form sensor 100 as shown in FIG. 3A-B.

When fully assembled, the first dielectric 116A and the second dielectric 116B are aligned such that surface 116X of the first dielectric 116A (see FIG. 5B) and surface 116Y of the second dielectric 116B (see FIG. 5A) are proximate one another. Also, as the shapes of the different components have complementary angled sides relative to adjacent portions of an assembled sensor 100, radial and axial forces may tend to "push" adjacent components together over time (e.g., while in use). As mentioned above, having close alignment of the different components may allow the accuracy of sensor 100 to be maintained over time.

Figure 6:
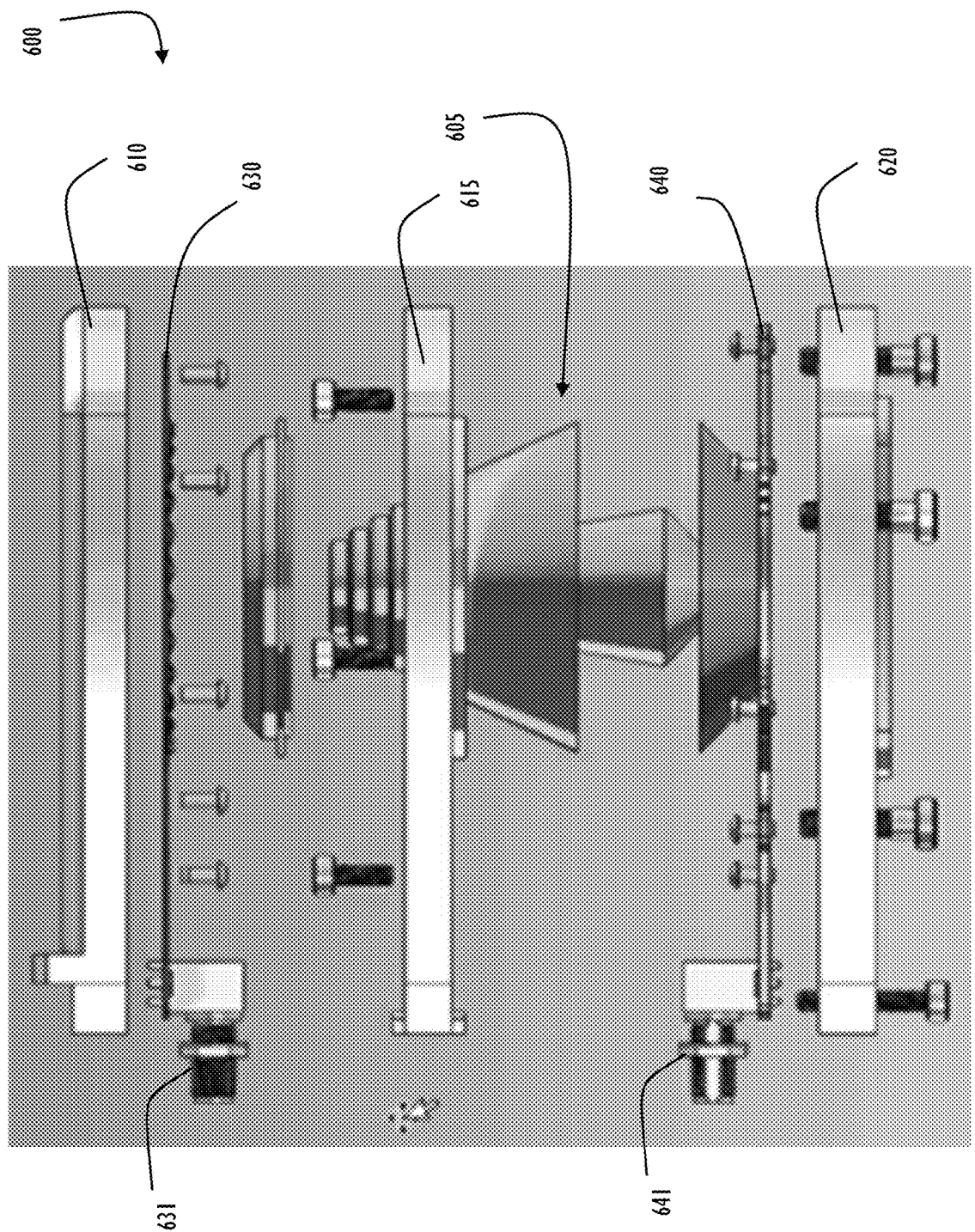
FIG. 6 depicts an exploded view of an assembly including the sensor of the present disclosure.

FIG. 6 depicts an exploded view of a sensor assembly 600 to illustrate another view and implementation of the sensor 100 discussed throughout the present disclosure. As shown in sensor assembly 600, sensor components 605 illustrate another example of dielectric 116 (the outer portion of sensor components 605) and an inner conductor 114 (which is the inner portion of sensor components 605). As shown here, sensor components 605 may be encased within a housing that includes pickups to become operational. Sensor assembly 600 is only one example of how sensor 100 may be enclosed and other implementations are possible.

In the example of sensor assembly 600, there is an upper housing 610, a middle housing 615, and a bottom housing 620. In this example, upper housing 610 is an example of first section 102 discussed above; middle housing 615 is an example of intermediate section 104 discussed above; and bottom housing 620 is an example of second section 106 discussed above.

In sensor assembly 600, there are also a pair of electric and magnetic couplers. In this example upper coupler is conductive plate 630 and functions like ring 108 discussed above. Also, in this example, lower coupler is conductive plate 640 and functions like ring 110 discussed above. In general, EM couplers may be "pick up" structures, which might be printed circuit board "PCB" based or made in some other fashion. Each of the conductive plates 630 and 640 may be secured as layers of the overall structure. The EM couplers may then each be electrically coupled to a respective input such as electrical input 631 for conductive plate 630 and electrical input 641 for conductive plate 640. In use, the inputs may be coupled to an electrical source (not shown). When fully assembled, as opposed to the exploded view of FIG. 6, the layered components of the overall structure may be proximate each other as are their corresponding components illustrated in FIG. 4A.

Figure 7:
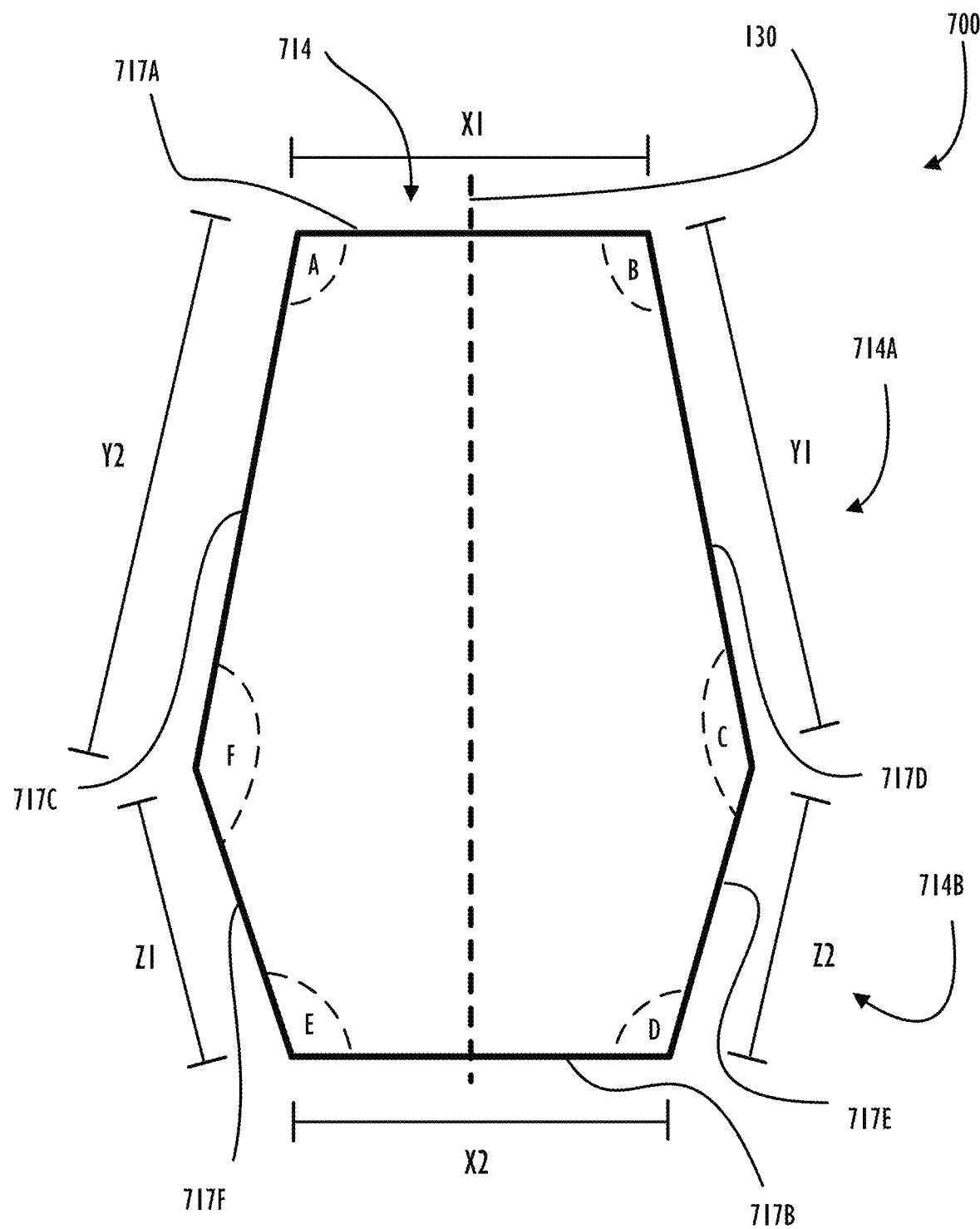
FIG. 7 is a schematic illustration of a central conductor of the sensor of FIG. 3A.

As used herein, a frustrum shape refers to a structure that generally has characteristics of a frustrum of a cone. The frustrum of a cone is the part of the cone without vertex when the cone is divided into two parts with a plane that is parallel to the base of the cone. Another name for the frustum of a cone is a truncated cone. The frustrum shape may be solid as is shown for central conductor 114 (which is made of an upper frustrum and a lower frustrum) or may be hollowed out (like an ice cream cone) as is shown for first dielectric 116A and its inverse second dielectric 116B. The two inverted frustrum shapes would form a two-dimensional profile of a trapezoid as illustrated in FIG. 7. In the illustrated embodiments of this disclosure, each of the upper frustrum and lower frustrum share a large diameter dimension and meet at there edges (See FIG. 7 at angles f and c). However, it is envisioned that the large diameter dimension may not be shared. In cases where the large diameter of the upper frustrum and lower frustrum are different, there would be a "ledge" or an "overhang" at the surface where the two inverted frustrums meet. Also, in cases where the large diameter dimensions are different, the internal cavities formed within first dielectric 116A and second dielectric 116B would be altered to conform to the shapes of respective portions of the central conductor 114 that are inserted therein.

FIG. 7 is a schematic illustration to illustrate the shape of a central conductor 714 which may provide the same function as central conductor 114 discussed above. Note that FIG. 7 is a two dimensional representation of a pair of inverted frustrum shapes that are positioned adjacent one another relative to their respective large diameter. Accordingly, central conductor 714 appears as a two-dimensional trapezoid in this drawing. This two-dimensional representation is for purposes of discussion and not intended to reflect an actual implementation of the disclosed central conductor 114. As illustrated, there are various segment lengths and angles that may be altered without departing from the overall scope of this disclosure. Note, elements 714A-B are related to elements 114A-B of central conductor 114 discussed above.

As illustrated in FIG. 7, which illustrates a cross-sectional view of the central conductor 714, the first portion 714A of the central conductor 714 generally defines a first frustrum shape (referred to above as the upper frustrum). Concurrently, the second portion 714B of the central conductor 714 generally defines a second frustrum shape (referred to above as the lower frustrum). Note that each of the first and second frustrum shapes are inverted relative to one another and therefore share a surface defined by their respective large diameter (which would represent a base of their corresponding cone shape).

The first frustrum shape of the first portion 714A defines a first surface 717A having a first small diameter (generally identified by line segment X1) and the second frustrum shape of the second portion 714B defines a second surface 717B having a second small diameter (generally identified by line segment X2). In some embodiments, the first and second small diameters (X1 and X2) may be equal. However, in other embodiments, the first small diameter (X1) may be greater than the second small diameter (X2) or the first small diameter (X1) may be lesser than the second small diameter (X2).

Central conductor 714 defines a vertical height along y axis 130 which runs along the length of the central conductor 714. The first portion 714A may have a vertical height along the length of the central conductor 714 that varies from implementation to implementation. For example, it is not necessary that first portion 714A and second portion 714B represent exactly half of central conductor 714. In some cases, the height of first portion 714A is one of: 50%, 60%, 70%, 80%, or 90% or any intermediate value therebetween (+/−5%) of the total height of the central conductor with second portion 714B being the remainder of the total height of 100%.

The first frustrum shape of the first portion 714A also has side surfaces 717C and 717D, each having a respective slant length (generally identified by line segment Y1 and Y2 which are equal in length). The first surface 717A and the second surface 717B are opposing one another such that the first and second frustrum shapes share a common large diameter at their junction.

The second frustrum shape of the second portion 714B has side surfaces 717E and 717F, each having a respective slant length (generally identified by line segments Z1 and Z2 which are again equal in length). Disposed between the respective surfaces of the central conductor 714 (where the side surfaces meet) are angles identified as angle A through angle F. The particular dimensions of the first and second frustrum shapes for different embodiments may be optimized to inhibit relative movement of the central conductor 114. Specifically, movement of central conductor 114 relative to the first and second dielectrics 116A, 116B may be minimized for predetermined axial and radial forces that may be experienced during use. Depending on the type and amount of force expected during use, different angles may be desirable.

With a fully assembled sensor 100, the interior space 115A of the first dielectric 116A has a shape that approximates and corresponds to the frustrum shape of the first portion 714A (or 114A above), and the interior space 115b of the second dielectric 116B has a shape that approximates and corresponds to the frustrum shape of the second portion 714B (or 114B above). The angular shape of the central conductor 714 (114 above) and the interior surfaces 115A, 115B of the respective dielectrics 116A, 116B aligning against surfaces of the first and second frustrum shapes results in the central conductor 714 (114 above) self-aligning in a tight arrangement with the respective corresponding surfaces. Specifically, interior surface 115A of first dielectric 116A will abut against surfaces associated with 717C and 717D in FIG. 7. Also, interior surfaces 115B of second dielectric 116B will abut against surfaces associated with 717E and 717F in FIG. 7.

Figure 1:
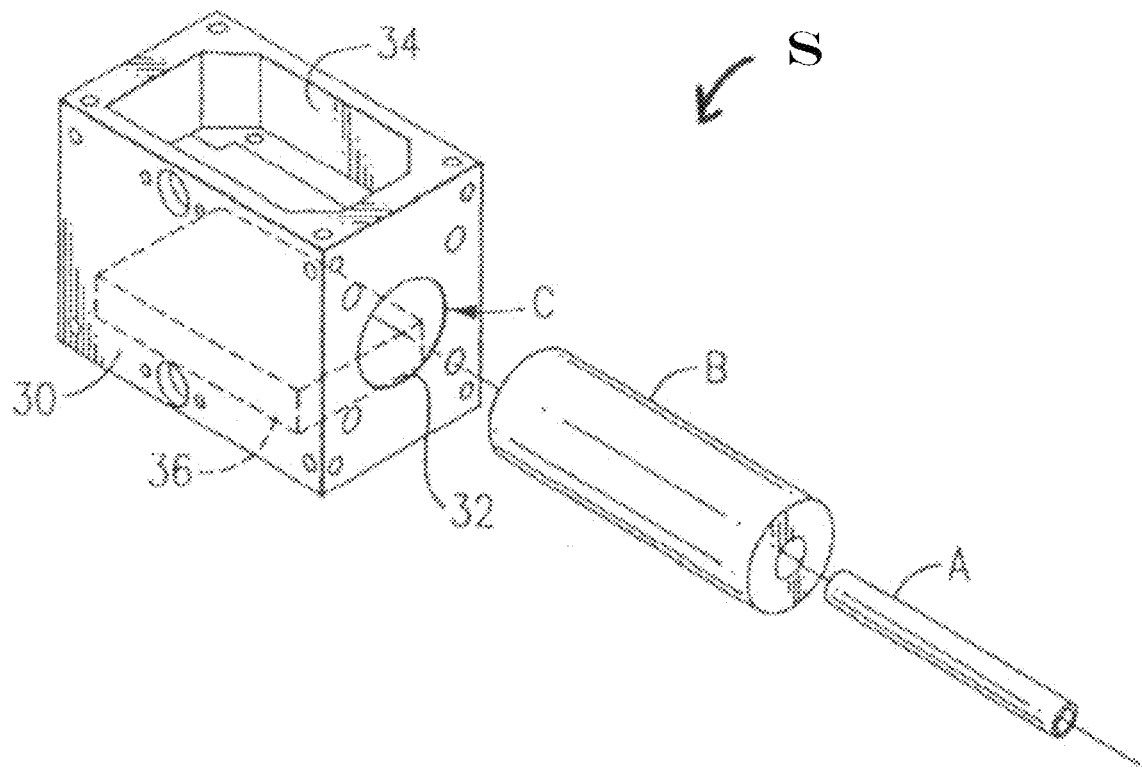
FIG. 1 is an exploded sectional view of an EMF sensor according to the prior art.
Figure 2B:
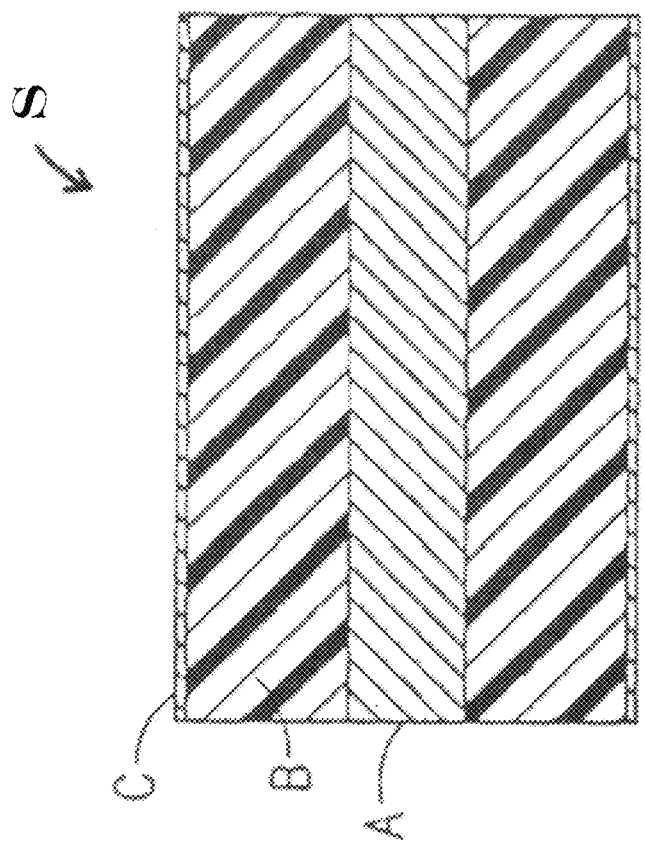
FIGS. 2A and 2B are end and side sectional views illustrating the transmission line structure of the sensor of FIG. 1.
Figure 2A:
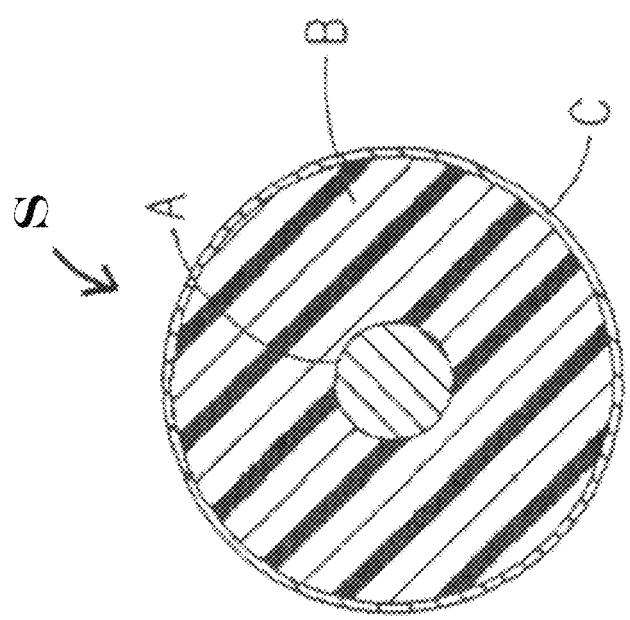

In contrast to the prior art, it should be noted that if all the surfaces of the central conductor and the insulating material were parallel with respect to one another (as illustrated in prior art FIGS. 1-2A-B), radial tolerances on parts would be required. As explained above, the radial tolerances would be required to inhibit the formation of any gaps between the respective surfaces of the central conductor (A in FIG. 1) and a corresponding dielectric (B in FIG. 1). These concerns are not present in disclosed embodiments of sensor 100.

Advantageously, when axial or radial forces may be applied to the central conductor 114 with respect to respective interior surfaces 115a, 115b of the first and second dielectrics 116A and 116B within which the central conductor 114 is disposed, the unique shape of the central conductor 114 as described above results in a tighter and closer interaction of the central conductor with respect to the interior surfaces 115a, 115b. This is advantageous over the previously described sensor S in which conductor A defines a cylindrical shape and is disposed within a corresponding interior shape of an insulating material B in which axial and/or radial forces between the conductor A and the insulating material B would result in the formation a non-uniform dielectric (e.g., perhaps caused by air gaps). As explained above, changes of effective dielectric or misalignment of an insulating material and a conductor element of a sensor would result in faulty readings or measurements.

This disclosure provides for relative axial and/or radial forces of the central conductor 114 and the dielectric materials 116A, 116B to actually result in a tighter fit. The fit is also "self-tightening" and therefore sensor 100 aligns properly during assembly and is able to maintain its accuracy and calibration over its lifespan.

Figure 8:
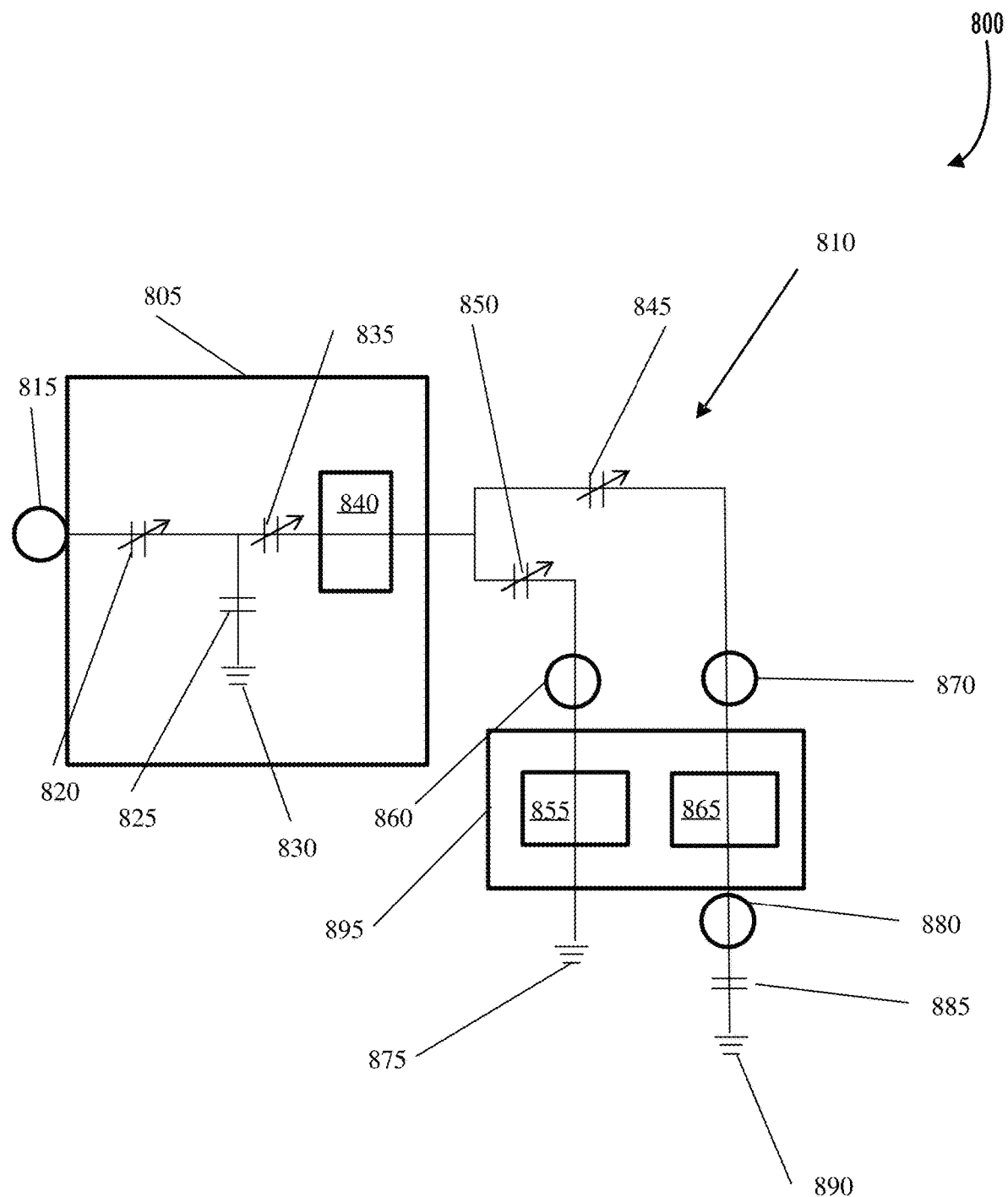
FIG. 8 is a schematic representation of a matching network according to embodiments of the present disclosure.

Turning to FIG. 8, a schematic representation of a matching network that may incorporate an implementation of sensor 100 discussed herein is illustrated according to embodiments of the present disclosure. In this embodiment, a matching network 800, such as those mentioned above, is illustrated having a matching branch 805 and a splitter branch 810. Matching branch 805 receives radio frequency power from an input 815. A first variable capacitor 820 of the matching branch 805 receives the radio frequency power from the input 815. First variable capacitor 820 may include a capacitor rated at approximately 10-2000 pF. A sensor such as sensor 100 discussed above may also be positioned at input 815.

First variable capacitor 820 is connected to a second capacitor 825, which is connected to a ground 830. Second capacitor 825 is also connected to a third variable capacitor 835. Third variable capacitor 835 may include a capacitor rated at approximately 10-2000 pF. Third variable capacitor 835 is also connected to an inductor 840, which further connects to splitter branch 810.

Splitter branch 810 receives radio frequency power from matching branch 805, which, splits the received radio frequency power between a fourth variable capacitor 845 and a fifth variable capacitor 850. Fourth variable capacitor 845 may be rated at approximately 10-2000 pF, while fifth variable capacitor 850 may be rated at approximately 10-2000 pF.

Fifth variable capacitor 850 is connected to an inner coil 855. Between fifth variable capacitor 845 and inner coil 855, one or more sensors 860 may be disposed. Sensor 860 (which may be implemented using sensor 100) may be used to measure, for example, voltage between fifth variable capacitor 850 and ground 875. Similarly, fourth variable capacitor 845 is connected to an outer coil 865. Between fourth variable capacitor 845 and outer coil 865, one or more sensors 870 may be disposed. Sensor 870 (which also may be implemented using sensor 100) may be used to measure, for example, voltage between fourth variable capacitor 845 and ground 890.

Inner coil 855 may further be connected to a ground 875 and outer coil 865 may be connected to circuitry that includes a sensor 880 (which also may be implemented using sensor 100) and a sixth capacitor 885. Sensor 880 may be used to measure, for example, voltage between outer coil 865 and ground 890. Inner coil 855 and outer coil 865 may be located outside of the matching network 800 circuitry, as indicated by offset box 895.

The circuitry illustrated in FIG. 8 may be used to tune first variable capacitor 820, third variable capacitor 835, fourth variable capacitor 845, and fifth variable capacitor 850. By tuning first variable capacitor 820, third variable capacitor 835, fourth variable capacitor 845, and fifth variable capacitor 850 the power provided to inner coil 855 and outer coil 865 may be adjusted.

The circuitry, which in one embodiment may be employed in matching network 800 as a current split ratio matching network, may be controlled using a programmable logic controller (not shown), which may be disposed in or otherwise connected to matching network 800. Suitable programmable logic controllers include many different types of printed circuit board (PCB) controllers (sometimes referred to as processors).

In other embodiments, the circuitry of matching network 800 may include fewer or additional components, and the orientation of the circuitry may differ. For example, fewer or greater numbers of variable capacitors, inductors, sensors, and the like may be present. Additionally, in certain embodiments, a different orientation of coils, antennas, and the like may be used to provide tuned radio frequency power to a reaction chamber (not shown in FIG. 8). Systems and methods disclosed herein may be used inductively coupled plasmas ("ICPs"), capacitively coupled plasmas ("CCPs"), helicon wave sources ("HWSs"), or any other plasma processing devices.

Figure 9:
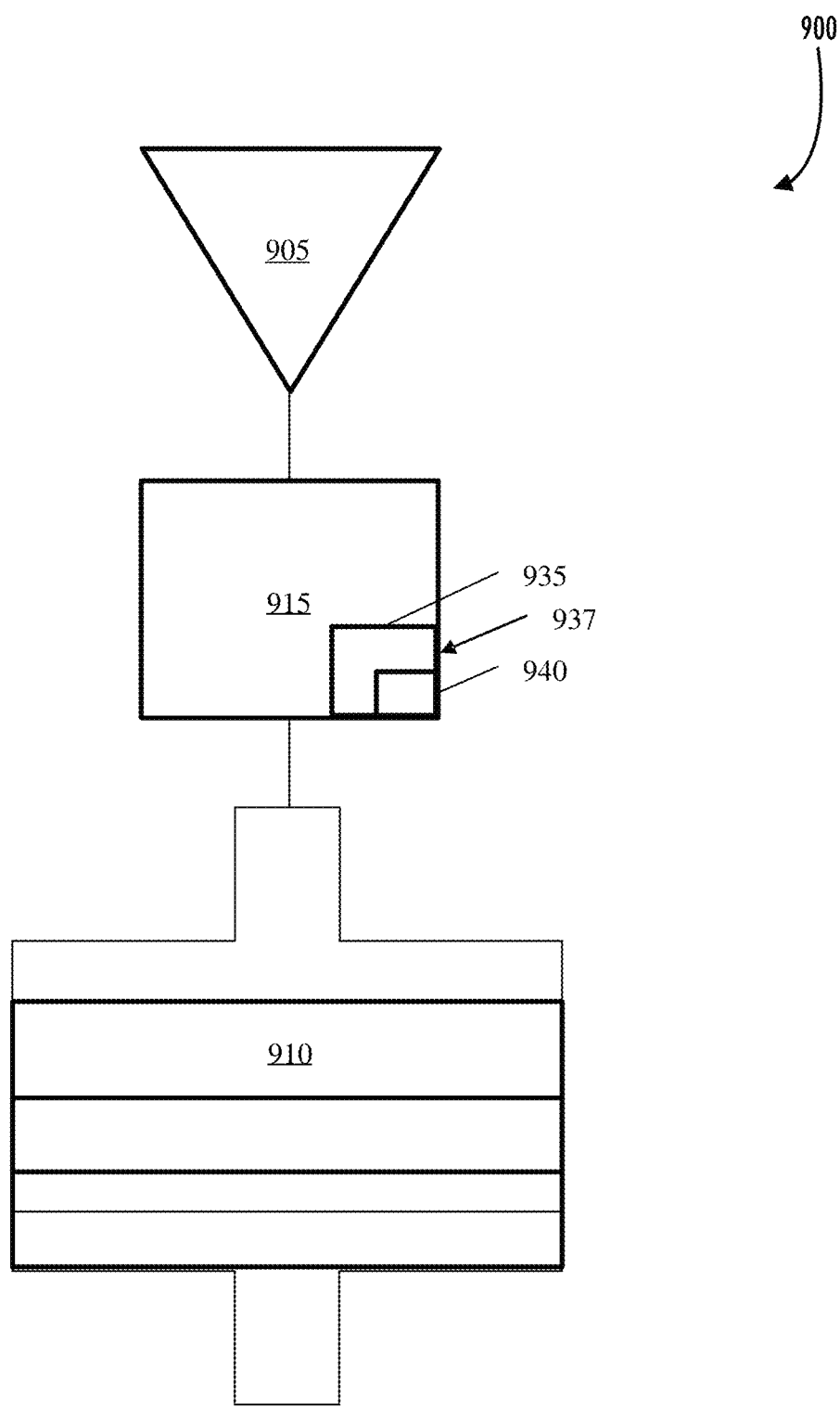
FIG. 9 is a schematic representation of a plasma processing device according to embodiments of the present disclosure.

Turning to FIG. 9, a schematic representation of a radio frequency plasma processing device 900 according to embodiments of the present disclosure is shown. In this embodiment, radio frequency plasma processing device 900 includes a radio frequency generator 905. Radio frequency generator 905 is configured to provide power to reaction chamber 910. Radio frequency generator 905 may provide power at a radio frequency between about 400 KHz and about 150 MHz. In certain embodiments, a second radio frequency generator (not shown) may also be present within radio frequency plasma processing device 900 and may provide power at a radio frequency that is the same, lower, or higher than radio frequency generator 905.

Reaction chamber 910 may include various components that allow for the processing of a manufacturing operation, such as those associated with the semiconductor industries. Reaction chamber 910 may include one or more sensors (not shown) for measuring certain properties occurring within reaction chamber 910. Reaction chamber 910 may also include a pedestal (also not shown) on which substrates to be manufactured may be placed during operation. Reaction chamber 910 may also include or otherwise be connected to coils (not individually shown), such as those discussed above, as well as showerheads, etc.

Radio frequency plasma processing device 900 may also include a matching network 915 (an example of a matching network 800 is illustrated and discussed above). Matching network 915 may be located between radio frequency generator 905 and reaction chamber 910. Matching network 915 may include variable capacitors (not shown), as well as other components to balance impedance between radio frequency generator 905 and reaction chamber 910, as discussed in greater detail above. During operation, the matching network may be tuned, e.g., by adjusting capacitor positions, in order to provide the matching impedances.

During operation, as power is supplied from radio frequency generator 905 to a plasma (not shown) within reaction chamber 910, a condition may occur, such as power may be reflected from reaction chamber 910. Such reflected power may result in undesirable conditions, which result in inefficient processing, damage to a substrate, damage to components of radio frequency plasma processing device 900, and the like. To resolve the condition and improve operability of radio frequency processing device 900, a tuning module 937 includes programmable logic controller 935 that may provide commands to matching network 915 to adjust a capacitor position, thereby providing matching impedances to minimize reflected power. Programmable logic controller 935 may be connected to storage device 940 to store these commands or data obtained during operation.

During operation, programmable logic controller 935 may identify a capacitor within matching network 915. The identifying may occur automatically or be controlled by an operator. Along with identifying the capacitor, the impedance of the matching network as a whole may be measured. Measuring the impedance of matching network 915 as a whole (e.g., by using one or more of sensor 100 distributed throughout the matching network) may include measuring a plurality of impedance values for one or more capacitors and/or other components within matching network 915. The capacitor may then be driven from a zero step value, which represents the point of minimum capacitance within its usable range to a higher step value to increase its capacitance and thereby tune the network (e.g., reduce power reflections)

While the present disclosure may have been shown and described with reference to various embodiments thereof, it will be understood by those skilled in the art that various changes in form and details may be made therein without departing from the spirit and scope of the present disclosure as defined by the appended claims and their equivalents. In other words, the various exemplary embodiments disclosed in the present specification and drawings are merely specific embodiments to facilitate an understanding of the various aspects of the present disclosure and are not intended to limit the scope of the present disclosure. For example, the particular ordering of steps may be modified or changed without departing from the scope and spirit of the present disclosure. Therefore, the scope of the present disclosure is defined not by the detailed description of the disclosure but by the appended claims, and all differences within the scope should be construed as being included in the present disclosure.

What is claimed is:

1. An electromagnetic field sensor, comprising:
a housing including an opening extending therethrough;
a dielectric element including a first section having a first interior space and a second section having a second interior space, the dielectric element positioned within the opening of the housing; and
a conductor disposed within and approximating the first interior space and the second interior space of the dielectric element, the conductor including a first portion defining a first frustrum shape and a second portion defining a second frustrum shape, the first interior space receiving the first portion of the conductor and the second interior space receiving the second portion of the conductor.

2. The electromagnetic field sensor of claim 1, wherein:
the housing includes an upper portion and a lower portion, the upper portion including a first opening and the lower portion including a second opening, the first and second openings together forming the opening extending through the housing,
the first section of the dielectric element forming a third frustrum shape of a first cone having a first hollowed out portion to form the first interior space, the first section positioned within the first opening,
the second section of the dielectric element forming a fourth frustrum shape of a second cone having a second hollowed out portion to form the second interior space, the second section positioned within the second opening,
the third frustrum shape of the first section receives, within the first interior space, an exterior surface of the first frustrum shape,
the fourth frustrum shape of the second section receives, within the second interior space, an exterior surface of the second frustrum shape, and
the first section positioned inversely, relative to a y-axis, from the second section such that a large diameter of the first frustrum shape is positioned adjacent a large diameter of the second frustrum shape and the conductor is substantially contained internally, to the first hollowed out portion and the second hollowed out portion, and between the first section and the second section.

3. The electromagnetic field sensor of claim 1, wherein:
the conductor is frictionally fit within the first interior space of the first section of the dielectric element.

4. The electromagnetic field sensor of claim 3, wherein:
the second section of the dielectric element maintains the conductor within the first section of the dielectric element.

5. The electromagnetic field sensor of claim 4, wherein:
the second frustrum shape of the conductor includes a slant length associated with an exterior surface along the slant length, the exterior surface positioned against the second interior space such that relative movement of the conductor with respect to the first section of the dielectric element is inhibited.

6. The electromagnetic field sensor of claim 2, further comprising:
a first conductive plate associated with the upper portion of the housing, the first conductive plate to provide a first pickup structure for an electric and magnetic coupler; and
a second conductive plate associated with the lower portion of the housing, the second conductive plate to provide a second pickup structure for the electric and magnetic coupler.

7. The electromagnetic field sensor of claim 6, wherein:
the first conductive plate forms a first ring associated with the first opening; and
the second conductive plate forms a second ring associated with the second opening.

8. The electromagnetic field sensor of claim 7, wherein:
the conductor is received within the first opening of the first conductive plate and the second opening of the second conductive plate such that the conductor is interior to the first ring and the second ring.

9. The electromagnetic field sensor of claim 1, wherein:
the first frustrum shape has a first small diameter for a first flat surface and a first large diameter for a second flat surface and a distance along an exterior surface of the first frustrum shape between the first flat surface and the second flat surface defines a first slant length; and
the second frustrum shape has a third small diameter for a third flat surface and a second large diameter for a fourth flat surface and a distance along an exterior surface of the second frustrum shape between the third flat surface and the fourth flat surface defines a second slant length.

10. The electromagnetic field sensor of claim 9, wherein:
the first slant length is greater than the second slant length.

11. The electromagnetic field sensor of claim 9, wherein:
the first large diameter is equal to the second large diameter.

12. The electromagnetic field sensor of claim 9, wherein:
the first large diameter is greater than the second large diameter or the second large diameter is greater than the first large diameter.

13. The electromagnetic field sensor of claim 1, wherein:
the first frustrum shape defines a vertical height that is greater than 50% of a total vertical height of the conductor.

14. The electromagnetic field sensor of claim 1, wherein:
the first frustrum shape has a first small diameter for a first flat surface and a first large diameter for a second flat surface and a distance along a tapered exterior surface of the first frustrum shape between the first flat surface and the second flat surface defines a first slant length, the tapered exterior surface including a plurality of steps along the first slant length; and
the second frustrum shape has a third small diameter for a third flat surface and a second large diameter for a fourth flat surface and a distance along an exterior surface of the second frustum shape between the third flat surface and the fourth flat surface defines a second slant length.

15. The electromagnetic field sensor of claim 1, wherein:
the first frustrum shape has a first small diameter for a first flat surface and a first large diameter for a second flat surface and a distance along an exterior surface of the first frustum shape between the first flat surface and the second flat surface defines a first slant length; and
the second frustrum shape has a third small diameter for a third flat surface and a second large diameter for a fourth flat surface and a distance along a tapered exterior surface of the second frustrum shape between the third flat surface and the fourth flat surface defines a second slant length, the tapered exterior surface including a plurality of steps along the second slant length.

16. The electromagnetic field sensor of claim 1, wherein radial and axial forces exerted thereon cause internal components of the electromagnetic field sensor to form a tighter frictional fit.

17. A matching network comprising:
a matching branch having a first variable capacitor and a second variable capacitor; and
a splitter branch having a third variable capacitor and a fourth variable capacitor that are electrically connected to the first variable capacitor and the second variable capacitor;
an outer coil connected to the third variable capacitor;
an inner coil connected to the fourth variable capacitor; and
an electromagnetic field sensor comprising:
  a housing including an opening extending therethrough;
  a dielectric element including a first section having a first interior space and a second section having a second interior space, the dielectric element positioned within the opening of the housing; and
  a conductor disposed within and approximating the first interior space and the second interior space of the dielectric element, the conductor including a first portion defining a first frustrum shape and a second portion defining a second frustrum shape, the first interior space receiving the first portion of the conductor and the second interior space receiving the second portion of the conductor.

18. The matching network of claim 17, wherein:
the housing includes an upper portion and a lower portion, the upper portion including a first opening and the lower portion including a second opening, the first and second openings together forming the opening extending through the housing,
the first section of the dielectric element forming a third frustrum shape of a first cone having a first hollowed out portion to form the first interior space, the first section positioned within the first opening,
the second section of the dielectric element forming a fourth frustrum shape of a second cone having a second hollowed out portion to form the second interior space, the second section positioned within the second opening,
the third frustrum shape of the first section receives, within the first interior space, an exterior surface of the first frustrum shape,
the fourth frustrum shape of the second section receives, within the second interior space, an exterior surface of the second frustum shape, and
the first section positioned inversely, relative to a y-axis, from the second section such that a large diameter of the first frustrum shape is positioned adjacent a large diameter of the second frustrum shape and the conductor is substantially contained internally, to the first hollowed out portion and the second hollowed out portion, and between the first section and the second section.

19. A radio frequency plasma processing device comprising:
a reaction chamber;
a radio frequency generator to supply radio frequency power to a plasma in the reaction chamber;
a matching network comprising:
  a matching branch having a first variable capacitor and a second variable capacitor; and
  a splitter branch having a third variable capacitor and a fourth variable capacitor that are electrically to the first variable capacitor and the second variable capacitor;
an outer coil connected to the third variable capacitor;
an inner coil connected to the fourth variable capacitor; and
an electromagnetic field sensor comprising:
  a housing including an opening extending therethrough;
  a dielectric element including a first section having a first interior space and a second section having a second interior space, the dielectric element positioned within the opening of the housing; and
  a conductor disposed within and approximating the first interior space and the second interior space of the dielectric element, the conductor including a first portion defining a first frustrum shape and a second portion defining a second frustrum shape, the first interior space receiving the first portion of the conductor and the second interior space receiving the second portion of the conductor.

20. The radio frequency plasma processing device of claim 19, wherein:
the housing includes an upper portion and a lower portion, the upper portion including a first opening and the lower portion including a second opening, the first and second openings together forming the opening extending through the housing,
the first section of the dielectric element forming a third frustrum shape of a first cone having a first hollowed out portion to form the first interior space, the first section positioned within the first opening,
the second section of the dielectric element forming a fourth frustrum shape of a second cone having a second hollowed out portion to form the second interior space, the second section positioned within the second opening, the third frustrum shape of the first section receives, within the first interior space, an exterior surface of the first frustrum shape, the fourth frustrum shape of the second section receives, within the second interior space, an exterior surface of the second frustum shape, and the first section positioned inversely, relative to a y-axis, from the second section such that a large diameter of the first frustrum shape is positioned adjacent a large diameter of the second frustrum shape and the conductor is substantially contained internally, to the first hollowed out portion and the second hollowed out portion, and between the first section and the second section.

* * * * *